(12) United States Patent
Berton

(10) Patent No.: US 7,205,771 B2
(45) Date of Patent: Apr. 17, 2007

(54) CURRENT-MEASURING CIRCUIT ARRANGEMENT

(75) Inventor: Farhad Berton, Augsburg (DE)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 11/301,678

(22) Filed: Dec. 13, 2005

(65) Prior Publication Data

US 2006/0125467 A1 Jun. 15, 2006

(30) Foreign Application Priority Data

Dec. 13, 2004 (DE) ...................... 10 2004 059 960

(51) Int. Cl.
*G01R 31/08* (2006.01)
*G01R 19/00* (2006.01)

(52) U.S. Cl. ..................... 324/522; 324/604; 327/53

(58) Field of Classification Search ............ 324/76.11, 324/522, 464–465, 604, 126
See application file for complete search history.

(56) References Cited

U.S. PATENT DOCUMENTS

| 3,392,341 | A | * | 7/1968 | Burns ......................... 330/277 |
| 4,827,207 | A | * | 5/1989 | Chieli ......................... 323/316 |
| 4,912,423 | A | * | 3/1990 | Milkovic et al. .............. 330/9 |
| 4,918,341 | A | * | 4/1990 | Galbraith et al. ............. 327/51 |
| 5,258,723 | A | * | 11/1993 | Mazzucco et al. .......... 330/258 |
| 5,270,660 | A | * | 12/1993 | Werner et al. ............... 324/457 |
| 5,276,405 | A | | 1/1994 | Mazzucco et al. |
| 5,323,115 | A | | 6/1994 | Werner, Jr. |
| 5,845,275 | A | | 12/1998 | Le Van Suu |
| 5,974,787 | A | * | 11/1999 | Lemire et al. ................ 60/274 |
| 6,084,418 | A | | 7/2000 | Takami et al. |
| 7,064,615 | B2 | * | 6/2006 | Krvavac et al. ............ 330/307 |
| 2005/0174103 | A1 | * | 8/2005 | Graf ........................... 324/126 |
| 2005/0213358 | A1 | * | 9/2005 | Feldtkeller ................... 363/95 |
| 2005/0252771 | A1 | * | 11/2005 | Wiedenmann et al. ...... 204/426 |

FOREIGN PATENT DOCUMENTS

| DE | 198 44 465 A1 | 4/2000 |
| DE | 10311096 A1 | 10/2003 |
| EP | 0525656 A1 | 2/1993 |
| EP | 1 211 776 A2 | 6/2002 |
| EP | 1 298 778 A2 | 4/2003 |
| EP | 1 372 261 A1 | 12/2003 |

* cited by examiner

*Primary Examiner*—Anjan Deb
(74) *Attorney, Agent, or Firm*—Senniger Powers

(57) ABSTRACT

The circuit arrangement for measuring current flowing through a high-resistance consumer (R1) contains a current mirror circuit (1), in the first branch (T1) of which the high-resistance consumer is connected in series and in the second branch of which an evaluation circuit (3, 4, 5) is connected. The high-resistance consumer is, in particular, a lambda probe (R1) of the catalytic converter of an internal combustion engine, whose resistance value is on the order of several MΩ and which is operated at high operating temperatures of around 400° C. Accordingly, very small currents on the order of several nA to several μA must be measured. Thanks to the current mirror circuit, a current ($I_{D2}$) is generated in the second branch that is equal in magnitude to the current ($I_{D1}$) flowing through the first branch and the consumer (R1). Thus, the current flowing through the second branch does not load the first branch. All components can be integrated in an integrated circuit, such as an ASIC.

19 Claims, 2 Drawing Sheets

CURRENT-MEASURING CIRCUIT ARRANGEMENT

FIELD OF THE INVENTION

The invention pertains to a current-measuring circuit arrangement.

BACKGROUND OF THE INVENTION

DE 198 44 465 A1 describes a current-measuring circuit arrangement which uses a current mirror circuit, and which has a first branch and a second branch, wherein the consumer is connected to the first branch and an evaluation circuit to the second branch. The first branch consists of a series circuit of a shunt resistor, a transistor, two additional resistors and a switching transistor with grounded emitter. An ohmic load as the consumer is connected at the node connecting the shunt resistor and the first-mentioned transistor. The second branch of the current mirror circuit consists of a series circuit of a resistor, a transistor, and another resistor, wherein the current mirror circuit is realized by connecting the base terminals of the two transistors. Furthermore, it is specified there that a Zener diode is connected in parallel with the circuit consisting of shunt resistor, first transistor, and resistor in the first branch of the current mirror circuit in order to regulate the voltage. In this circuit arrangement, the current flowing through the shunt resistor branches at the current mirror circuit, so that a first partial current flows through the consumer and a second partial current flows through the first branch of the current mirror circuit. Thus, the current in the second branch of the current mirror circuit is not identical to the current being measured through the consumer, so that the measurement accuracy for measuring the current through the consumer is poor, and this document also indicates that it is only around 5%. Moreover, the consumer is of relatively low resistance, since it is intended to be a motor vehicle headlight. Therefore, the load current is on the order of about 4 A to 12 A.

U.S. Pat. No. 5,845,275 shows a circuit arrangement for measuring an electric current with a nonlinear element for the current-to-voltage conversion in the form of a fuzzy logic processor with a nonlinear semiconductor element.

EP 1 298 778 A2 describes a constant-current source, in the control loop of which a sawtooth generator is used.

EP 1 372 261 A1 shows a current measurement circuit with a current mirror circuit made up of MOS transistors. The circuit there is used to control the current for a photodiode.

Finally, EP 1 211 776 A2 describes an inductive power distribution system with a circuit that is intended to hold the output voltage within given limits when resonances appear due to inductances.

SUMMARY OF THE INVENTION

The objective of the present invention is the measurement of very small electric currents in the range of a few nA to several µA. Such small currents occur in lambda probes, which are used in the catalytic converters of internal combustion engines. This very small electric current indicates the gas concentration being detected by the lambda probe. The resistance value of ordinary lambda probes is on the order of about 500 kΩ to several MΩ, e.g., 5 MΩ. At the usual operating voltages in motor vehicles, the current flowing through the lambda probe is then on the order of the aforementioned several nA to several µA. The conventional lambda probes are based on ceramic material and are operated at high temperatures on the order of 400° C. At these high temperatures, the electrical resistance value then continues to rise. Accordingly, the currents flowing through the lambda probe that must be measured are extremely small.

In practice, therefore, to measure currents, very accurate precision measurement resistors are used, which are trimmed by means of laser beams and adjusted to the particular measurement range. The laser-trimming of measuring resistors is very time-consuming. Furthermore, such measuring resistors are relatively highly temperature-dependent and exhibit poor electromagnetic compatibility in interference fields. The use of such precision measuring resistors in difficult environments, such as that of motor vehicles, is therefore problematic, as well as expensive due to the high costs of manufacture.

The problem of the invention is therefore to design a circuit arrangement that measures very small electric currents, produces a highly precise measurement result, is immune to interference, and has low manufacturing costs.

The problem is solved by the features indicated in claim 1. Advantageous embodiments and modifications of the invention will be found in the subordinate claims.

The basic principle of the invention lies in using a current mirror circuit, in the first branch of which the high-resistance consumer is arranged and in the second branch of which an evaluation circuit is connected. In a current mirror circuit, current of equal magnitude flows in both branches. The current through the first branch and the consumer, such as a lambda probe, for example, is mirrored as it were, in the second circuit, where the second circuit does not load the first circuit and therefore also does not falsify the measurement result. In order to further process such small currents in an evaluation circuit, a transimpedance amplifier is connected to the second branch of the current mirror circuit, which converts the current through the second branch into a voltage value, thereby performing signal conditioning for the evaluation circuit.

According to an advantageous development of the invention, the electrical consumer is a lambda probe with a resistance value on the order of 500 kΩ to around 5 MΩ.

According to another advantageous development, the signal conditioning is performed by a PWM converter, which converts the signal input to it into a pulse-width modulated signal. This has the benefit that the pulse-width modulated signal can be transmitted without disturbance over long distances, even in a noisy environment such as that of a motor vehicle. Preferably, the PWM converter consists of a comparator and a sawtooth generator.

According to another development of the invention, the current mirror circuit is operated at a higher operating voltage than the battery voltage in the vehicle. For this purpose, a step-up converter or a charge-pump is provided, which generates the higher operating voltage for the current mirror circuit from the existing battery voltage.

Preferably, the step-up converter or the charge-pump is load-dependent in its operation, so that the switching frequency varies as a function of the current through the consumer. The purpose of this is to furnish a constant operating voltage to the current mirror circuit, regardless of the given load.

According to another development of the invention, the input to the power supply of the overall circuit and/or the signal output of the circuit each have a circuit protecting against voltage surges and the build-up of electrostatic charge, which is preferably realized by a varistor.

According to another development of the invention, the overall circuit arrangement, except for the load, is constructed as an integrated circuit (ASIC).

DETAILED DESCRIPTION OF PREFERRED EMBODIMENTS

This application claims priority from German patent application 10 2004 059 960.2, the entire disclosure of which is incorporated by reference.

Figure 1:
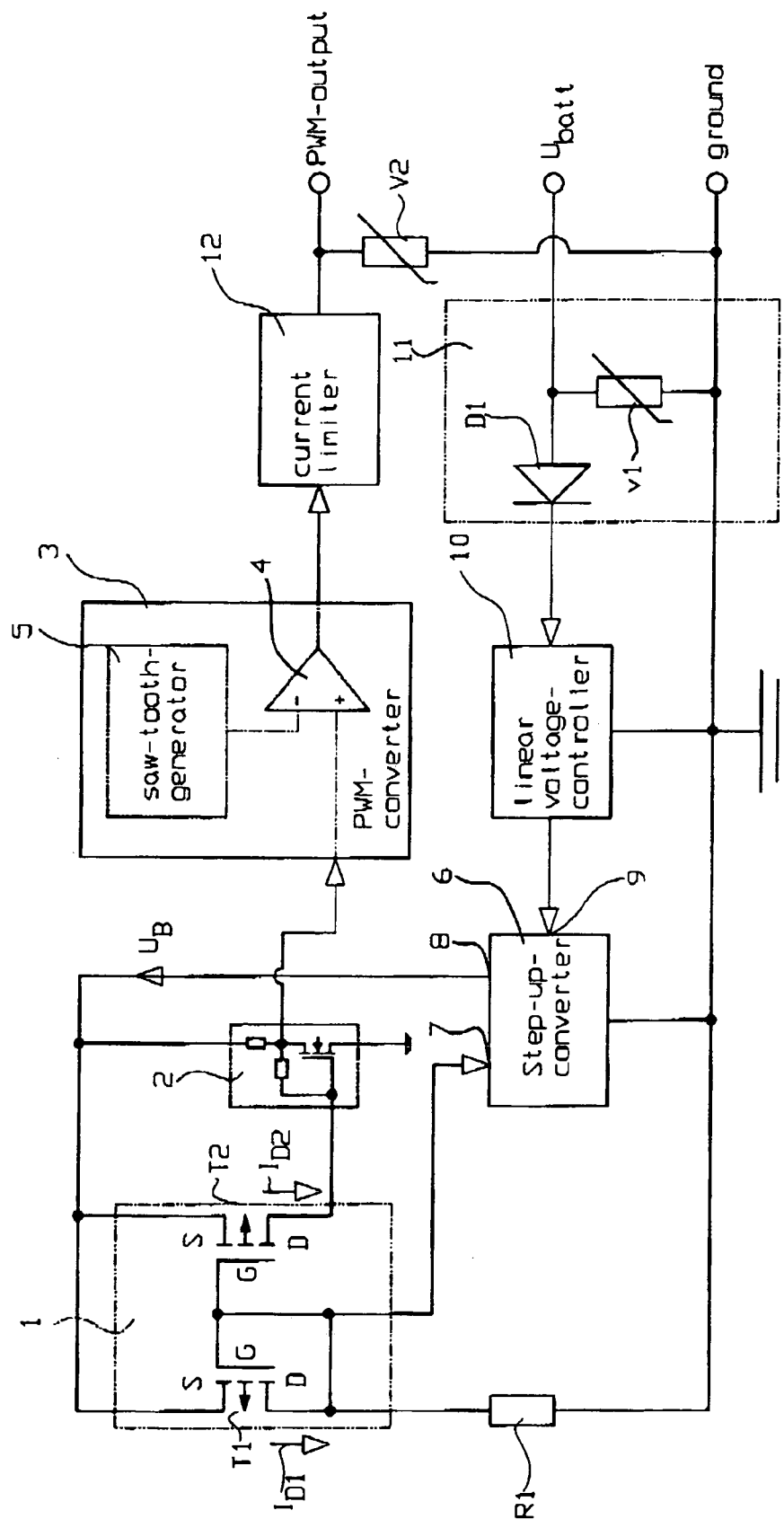
FIG. 1, a block diagram of the circuit arrangement of the invention.

FIG. 1 shows the circuit arrangement of the invention, with which the electric current flowing through a consumer R1 is measured. The consumer R1 is represented here as a resistor. For example, it can be a lambda probe which, during normal operation (for example, at an ambient temperature of around 400° C.), has a very high resistance value on the order of several MΩ. To measure the current flowing through this consumer R1, a current mirror circuit 1 is provided, which has two parallel branches, each formed by a transistor, T1 and T2. Preferably, self-biased FET transistors operating in the pinch-off region are used. The source terminals S of the two transistors T1 and T2 are connected together and supplied with an operating voltage $U_B$, which shall be further discussed hereafter. The drain terminal D of the transistor T1 in the first branch is connected to one terminal of the consumer R1, whose other terminal is at ground. The gate terminals G of the two transistors T1 and T2 are connected to each other and to the drain terminal of the transistor T1. Since the gate and drain of the first transistor T1 are short-circuited:

$U_{DS}=U_{GS}$ and $U_{GD}=0$

Due of the properties of the current mirror circuit, the current $I_{D1}$ flowing through the consumer R1, which also flows through the source-drain channel of the transistor T1, corresponds exactly to the current $I_{D2}$ flowing through the source-drain channel of the second transistor T2. This current $I_{D2}$ is input to a transimpedance amplifier 2, where it is transformed into a proportional voltage, and from there goes to a PWM converter 3, which converts the output signal of the transimpedance amplifier 2 into a pulse-width modulated signal. The PWM converter 3 contains, for example, a comparator 4, one input of which receives the output signal of the transimpedance amplifier 2 and whose other input receives the output signal of a sawtooth generator 5. The sawtooth generator 5 produces, in a known way, a periodic output signal that increases linearly over time and then drops nearly vertically. If the sawtooth voltage of the sawtooth generator 5 exceeds the output voltage of the transimpedance amplifier, the comparator 4 switches from "High" to "Low" or from "Low"to "High," depending on the polarity at the terminals, thereby forming a pulse-width modulated signal.

The circuit arrangement of the invention will be used primarily to measure the current through a lambda probe of a motor vehicle. The conventional battery voltage $U_{batt}$ in most motor vehicles is 12 or 24 V, depending on the type of vehicle. Most lambda probes, on the other hand, must be operated at a higher voltage $U_B$, on the order of 30 V, to obtain suitable measurement results. In order to convert the battery voltage $U_{batt}$ into the higher operating voltage $U_B$, there is provided a voltage converter 6, which is preferably configured as a step-up converter with charge-pump. However, one can also use a step-up converter with inductors. Such known converters operate with electronic switches that are activated at varying speeds, depending on the load, in order to generate a constant voltage at their output. The step-up converter 6 therefore has a control input 7, which is connected to the drain terminal D of the transistor T1, and thus changes the switching frequency of the step-up converter 6 as a function of the magnitude of the current $I_{D1}$ so that the desired voltage of, e.g., 30 V is present at the output 8 of the step-up converter. This voltage $U_B$ is applied to the source terminals S of the two transistors T1 and T2.

One input terminal 9 of the step-up converter is connected via a linear voltage controller 10 and a protection circuit 11 to the battery voltage $U_{batt}$. The protection circuit 11 contains a forward-biased diode D1, serving as pole reversal protection, as well as a varistor V1, which serves to protect against voltage surges and static build-up. Such components are also known as ESD (electricostatic discharge) protection devices and are connected, as shown, between battery voltage $U_{batt}$ and ground.

The output of the PWM converter 3 in the practical application for measurement of current with a lambda probe is further connected to a current limiter 12, with open drain output. This output can also be provided with an ESD protection in the form of a varistor V2.

The two transistors T1 and T2 are preferably of the (p-channel) enhancement mode type and are therefore self-biasing.

All of the components can be combined into an integrated circuit, such as an ASIC.

The sawtooth generator in one embodiment operates at constant frequency of around 100 kHz. The PWM signal at the output of the PWM converter 3 thus has a resolution of 10 bits in the described application. By increasing the frequency of the sawtooth voltage to 400 kHz or 1.6 MHz, one can also achieve a resolution of 12 or 14 bits, respectively.

Figure 2:
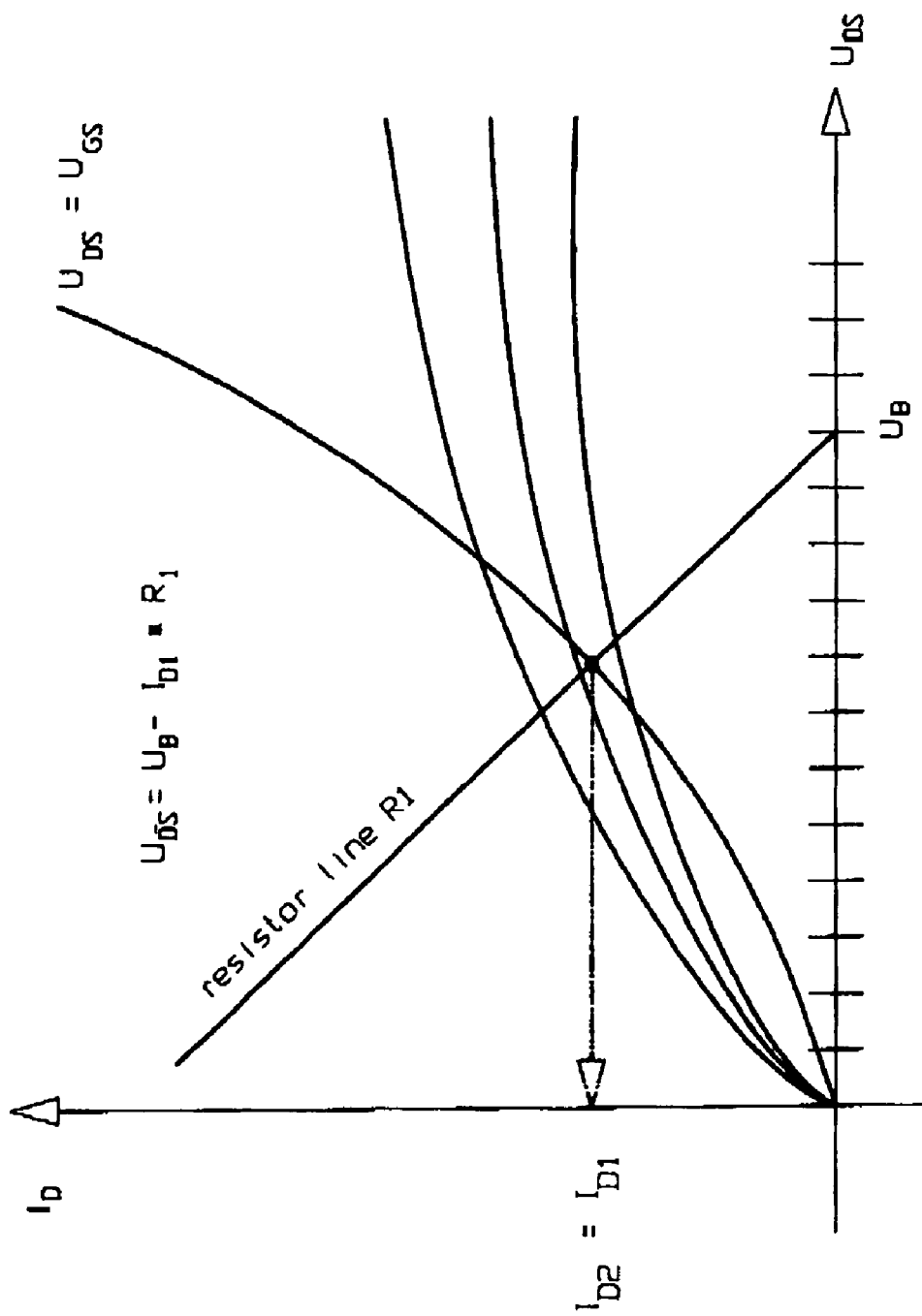
FIG. 2, a diagram of the current plotted against the drain-source voltage of the current mirror circuit.

The mode of operation of the current mirror circuit 1 will be explained in connection with FIG. 2. The self-biased FET transistors T1 and T2 operate in the pinch-off region. Thus, the operating point is the point of intersection of the resistor lines R1. Since the transistor T2 is controlled by the same voltage $U_{GS}$ as the transistor T1, the drain current $I_{D2}$ is equal to the load current $I_{D1}$.

Finally, it should also be mentioned that several of the modules used are commercially available as integrated circuits. For example, a "low-dropout linear voltage regulator" of type ADP667 from Analog Devices can be used as the linear voltage 10 in FIG. 1. A "micropower step-up DC/DC converter in ThinSOT" of type LT1615 from Linear Technology corporation, or a "turboswitch in a PFC boost converter" of type AN603 from STMicroelectronics can be used as the step-up converter 6 of FIG. 1.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several-objects of the invention are achieved and other advantageous results attained.

As various changes could be made in the above methods and products without departing from the scope of the invention, it is intended that all matter contained in the above description and shown in the accompanying drawings shall be interpreted as illustrative and not in a limiting sense.

What is claimed is:

1. A current-measuring circuit arrangement for measuring the current flowing through a consumer, comprising:
   a current mirror circuit, having a first branch and a second branch, wherein the consumer is connected to the first branch; and
   an evaluation circuit is connected to the second branch;
   wherein the consumer has high resistance, the consumer is connected in series with the first branch, and a transimpedance converter is connected between the second branch of the current mirror circuit and the evaluation circuit; and
   wherein the evaluation circuit has a voltage/pulse-width-modulation converter.

2. The circuit arrangement of claim 1 wherein the consumer is a lambda probe with a resistance value on the order of 500 kΩ to 5 MΩ.

3. The circuit arrangement of claim 1 wherein the voltage/pulse-width-modulation converter has a sawtooth generator and a comparator, one input of which receives the output signal of the sawtooth generator and the other input of which receives the output signal of the current mirror circuit or the transimpedance amplifier.

4. The circuit arrangement of claim 3 wherein the current mirror circuit has two self-biasing field-effect transistors of the enhancement mode type.

5. The circuit arrangement of claim 1 wherein a current limiter is connected to the voltage/pulse-width-modulation converter on the load side.

6. The circuit arrangement of claim 5 wherein a varistor is connected to the voltage/pulse-width-modulation converter or the current limiter on the load side.

7. The circuit arrangement of claim 1 wherein a varistor is connected to the voltage/pulse-width-modulation converter or the current limiter on the load side.

8. The circuit arrangement of claim 3 wherein all modules of the circuit arrangement, with the exception of the consumer, are combined into an integrated circuit.

9. A current-measuring circuit arrangement for measuring the current flowing through a consumer, comprising:
   a current mirror circuit, having a first branch and a second branch, wherein the consumer is connected to the first branch; and
   an evaluation circuit is connected to the second branch;
   wherein the consumer has high resistance, the consumer is connected in series with the first branch, and a transimpedance converter is connected between the second branch of the current mirror circuit and the evaluation circuit; and
   wherein the current mirror circuit has two self-biasing field-effect transistors of the enhancement mode type.

10. The circuit arrangement of claim 9 wherein current for the current mirror circuit is supplied from a step-up converter, which is powered by a battery voltage (Ubatt) and generates a higher output voltage (UB) than the battery voltage.

11. A current-measuring circuit arrangement for measuring the current flowing through a consumer, comprising:
    a current mirror circuit, having a first branch and a second branch, wherein the consumer is connected to the first branch; and
    an evaluation circuit is connected to the second branch;
    wherein the consumer has high resistance, the consumer is connected in series with the first branch, and a transimpedance converter is connected between the second branch of the current mirror circuit and the evaluation circuit; and
    wherein current for the current mirror circuit is supplied from a step-up converter, which is powered by a battery voltage (Ubatt) and generates a higher output voltage (UB) than the battery voltage.

12. The circuit arrangement of claim 11 wherein one branch of the current mirror circuit is connected to a control input of the step-up converter, with which the switching frequency of the step-up converter is controlled as a function of the current flowing through this branch of the current mirror circuit.

13. The circuit arrangement of claim 12 wherein a linear voltage controller is connected in series with the step-up converter.

14. The circuit arrangement of claim 12 wherein a protection circuit is connected in series with the step-up converter.

15. The circuit arrangement of claim 11 wherein a linear voltage controller is connected in series with the step-up converter.

16. The circuit arrangement of claim 15 wherein a protection circuit is connected in series with the step-up converter.

17. The circuit arrangement of claim 11 wherein a protection circuit is connected in series with the step-up converter.

18. The circuit arrangement of claim 17 wherein the protection circuit has at least one varistor.

19. The circuit arrangement of claim 17 wherein the protection circuit has a forward-biased diode.

* * * * *